United States Patent
Park (10) Patent No.: US 7,327,630 B2
(45) Date of Patent: Feb. 5, 2008

(54) MEMORY CELL POWER SWITCHING CIRCUIT IN SEMICONDUCTOR MEMORY DEVICE AND METHOD FOR APPLYING MEMORY CELL POWER VOLTAGE

(75) Inventor: Chul-Sung Park, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 11/332,122

(22) Filed: Jan. 13, 2006

(65) Prior Publication Data
US 2006/0152966 A1    Jul. 13, 2006

(30) Foreign Application Priority Data
Jan. 13, 2005    (KR) .................... 10-2005-0003109

(51) Int. Cl.
*G11C 7/00* (2006.01)
(52) U.S. Cl. .................. 365/226; 323/313; 327/544; 327/546; 365/154; 365/229
(58) Field of Classification Search ................ 365/154, 365/226, 229; 323/313; 327/544, 546
See application file for complete search history.

(56) References Cited
U.S. PATENT DOCUMENTS

| | | | |
|---|---|---|---|
| 5,337,284 A | 8/1994 | Cordoba et al. | |
| 5,726,562 A * | 3/1998 | Mizuno | 323/312 |
| 5,808,930 A * | 9/1998 | Wada et al. | 365/63 |
| 6,795,366 B2 | 9/2004 | Lee | |
| 6,836,179 B2 * | 12/2004 | Mizuno et al. | 327/544 |
| 6,999,338 B1 * | 2/2006 | Hirabayashi | 365/154 |

\* cited by examiner

*Primary Examiner*—Hoai V. Ho
(74) *Attorney, Agent, or Firm*—F. Chau & Associates, LLC

(57) ABSTRACT

A power (voltage) switching circuit in a semiconductor memory device, capable of reducing leakage current in a standby mode of operation and shortening the wake-up time when a standby mode is switched to an operation mode. The power (voltage) switching circuit comprises a first power switch, a second power switch, and a third power switch operatively connected to at least one bitline in a memory cell array, configured to selectively output, as a cell power voltage, a dynamically selected one of a first power supply voltage, a second power supply voltage, and a third power supply voltage, respectively in response to a first, second or third applied switch control signals. The second power supply voltage being higher than the first power supply voltage and, the third power supply voltage being lower than the first power supply voltage. A cell power control unit controls states of the first, second and third switch control signals so that the cell power voltage is applied as the third (lowest) power supply voltage in a standby state and that when the standby state is switched to an operating state the cell power voltage is supplied as the second (highest) power supply voltage during a predefined period of time and then as the first power supply voltage.

19 Claims, 11 Drawing Sheets

MEMORY CELL POWER SWITCHING CIRCUIT IN SEMICONDUCTOR MEMORY DEVICE AND METHOD FOR APPLYING MEMORY CELL POWER VOLTAGE

CROSS-REFERENCE TO RELATED APPLICATION

This application claims the priority, under 35 U.S.C. § 119, of Korean Patent Application No. 10-2005-0003109, filed Jan. 13, 2005, the contents of which is hereby incorporated herein by reference in its entirety.

BACKGROUND OF THE INVENTION

1. Technical Field

The present invention relates to memory cell power supply in a semiconductor memory, and more particularly, to a memory cell power switching circuit in a volatile semiconductor memory device, such as a static random access memory (SRAM), and a method for applying a memory cell power voltage.

2. Discussion of Related Art

As processor based systems such as personal computers and electronic communication devices achieve higher performance, greater speed and higher-integration, the performance of volatile semiconductor memory devices such as static random access memories (SRAMs) has correspondingly been increased. In a semiconductor memory device used in mobile electronic devices such as a handheld phone or a notebook computer, low power consumption is especially desirable. Accordingly semiconductor manufactures continuously endeavor to reduce the operation current and standby current of memory devices, to provide a mobile-oriented low-power solution.

To reduce standby current in an SRAM, a technique is known in the art of applying a voltage smaller than a normal operation voltage in a standby state, (i.e., not a operating state in which data input and output is performed). In such a technique, the current characteristic of a memory device may be deteriorated due to very great load capacitance when the standby state is switched to the operating state. Thus, when there is a transition between the operation modes, a long time (and current) is needed to transit from the standby voltage (a relatively smaller than the operation voltage) to reach the operation voltage. Thus, while the above-described prior art can reduce the standby current there may be degradation of a device current characteristic, and the prior art is not optimal for employment in several fields.

Figure 1:
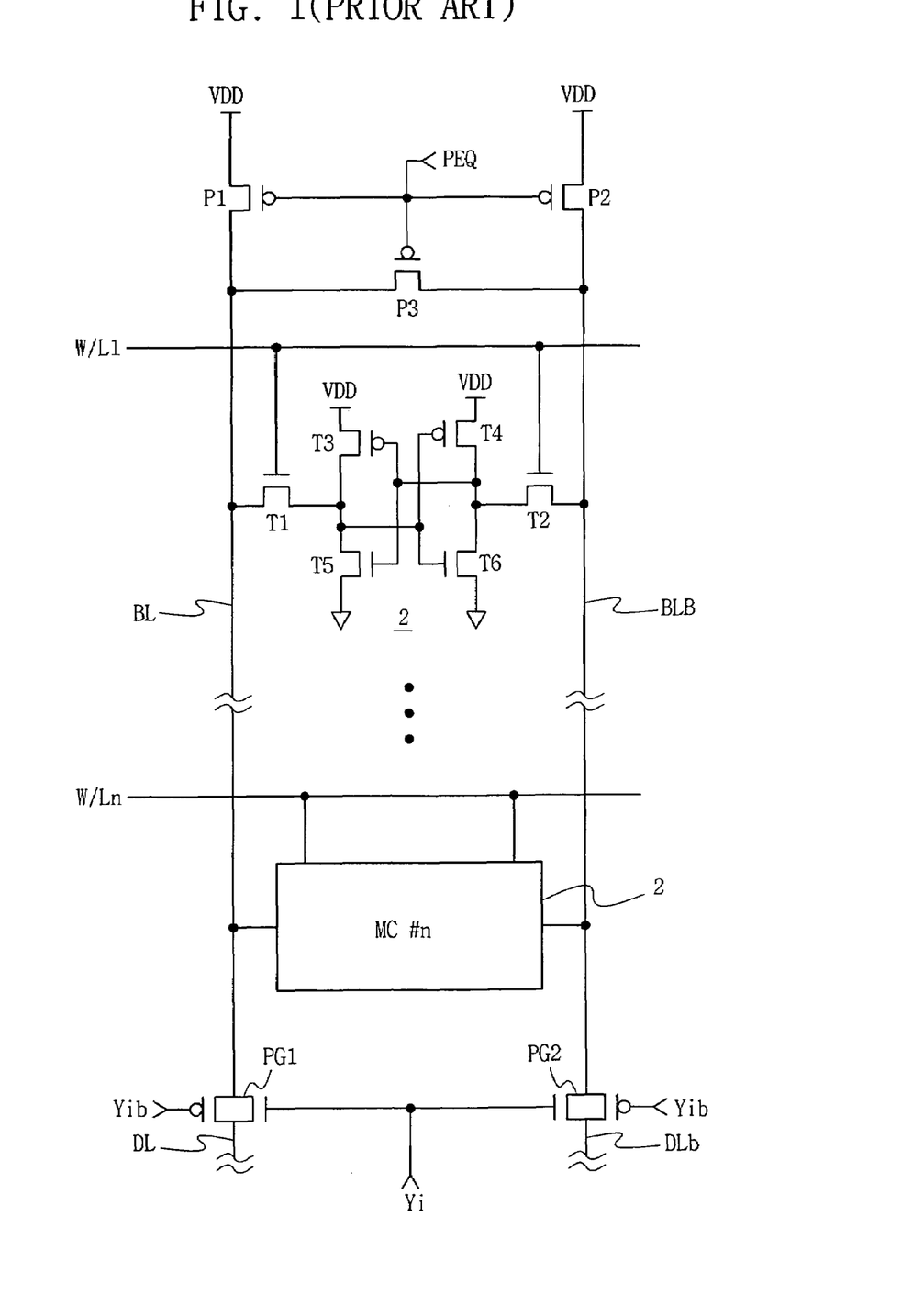
FIG. 1 is a memory cell core circuit diagram of a typical SRAM device.

FIG. 1 is a schematic circuit diagram showing a (memory) cell core circuit of a conventional SRAM (static random access memory). In FIG. 1, is one representative bit line pair (BL, BLB) is shown. It is to be noted that a plurality of memory cells associated with the same bit line pair (BL, BLB) together with a plurality of memory cells associated with other bit line pairs may form a memory cell block; and a plurality of memory cell blocks may form one memory cell array.

Referring to FIG. 1, a plurality (n) of memory cells 2 (including MC #n) are connected between the pair of bit lines BL and BLB. The circuit of each of the unit memory cells 2 may be implemented as a full CMOS SRAM cell including six transistors (T1 to T6) as well known in the art. Each SRAM cell includes access transistors T1 and T2 and load transistors T3 and T4. If the cell pitch (e.g., width) of an SRAM cell is reduced to near the resolution limitation of a photolithography process, the six transistors may be laid out on a different layer, (e.g., not the same layer), in a three-dimensional form.

In FIG. 1, precharge transistors P1 and P2 (for precharging the bit lines BL and BLB, respectively) in response to a control signal PEQ and an equalizing transistor P3 (for maintaining the same voltage level on both of the bit lines BL and BLB). Further, each of word lines W/L1 and W/Ln is connected to the gate of each of the access transistors T1 and T2 in the corresponding unit memory cell 2. Column select gates PG1 and PG2 for electrically connecting or disconnecting between the bit line pair and the data line pair (DL & DLb) are connected to the bit line BL and the complementary bit line BLB, respectively. Both of the column select gates PG1 and PG2 are turned OFF in response to column select signals Yi and Yib in a standby mode and conversely may be turned ON or OFF (in response to column select signals Yi and Yib) during an access operation mode in which reading or writing data is performed.

In FIG. 1, an operating voltage VDD is applied (as a memory cell power voltage) to source terminals of P-type MOS load transistors T3 and T4 (among the transistors T1 through T6 constituting the unit memory cell 2) so that a data storage operation is performed. The operation voltage VDD, applied to the load transistors T3 and T4, should be provided at a predetermined level in an access mode of operation of the memory cell but in the standby mode may be provided at a voltage level lower than the operation voltage (to reduce leakage current flowing through the load transistors T3 and T4). However, if the memory cell power voltage applied to the load transistors T3 and T4 is changed from a (lower) standby voltage to a (higher) operating voltage immediately after the standby mode is changed to the operation mode, load capacitance becomes very large due to a change in a cell power load. This increases the cell wake-up time and degrades an operating characteristic of the semiconductor memory device.

Further, if the device enters a standby mode (when a standby voltage lower than the operation voltage is applied) e.g., whenever a memory cell block including memory cells is not selected during a relatively short period of time, stability of the operation is not guaranteed due to too frequent wake-ups.

Accordingly, there is a need for a technique for reducing standby current without degrading the operating characteristic of a device and for shortening a wake-up time so that a cell power voltage is rapidly recovered to a stable level of an operation voltage without degrading the operating characteristic when a standby mode is switched to an operation mode.

SUMMARY OF THE INVENTION

Various embodiments of the invention utilize the inventor's realization that, if a high voltage is briefly applied as the cell power voltage at the beginning of the operating period and then the operation voltage is applied, the wake-up time may be significantly shortened and the performance of the semiconductor memory device may be enhanced, as compared with the conventional case where the operation voltage is continuously applied as the cell power voltage at the beginning of the operating period.

Various aspects of the present invention provide a technique and a semiconductor memory device that reduce standby current without degrading the operating characteristic of a device and that shorten the wake-up time so that a memory cell power voltage is rapidly recovered (from a lower, standby level) to a stable level of a (higher) operating voltage, without degrading the operating characteristic when a standby mode is switched to an operation mode.

An embodiment of the invention applies a standby voltage as a memory cell power voltage only when a standby mode lasts for a relatively long period of time.

Another aspect of the present invention provides a semiconductor memory device capable of reducing (or minimizing) current consumption in a standby mode of operation without degrading a memory device (performance) characteristic.

Other aspects of the present invention provide a memory cell power switching circuit in a semiconductor memory device and a method for applying a cell power voltage, capable of suppressing leakage current in a standby mode of operation and of shortening the wake-up time when transitioning from standby mode to an operation (access) mode.

Further aspects of the present invention provide a cell power switching circuit in a semiconductor memory device and a method for applying a cell power voltage, capable of controlling the cell power voltage (applied to a load P-type MOS transistor in a static random access memory (SRAM) having full CMOS memory cells) to be an optimal level depending in each of the standby mode and the operation mode.

Still other aspects of the present invention provide a cell power switching circuit in a semiconductor memory device and a method for applying a cell power voltage, capable of reducing the standby current using a dual power mode switching structure and reducing the wake-up time of a cell power voltage (when transiting from a standby mode to an operating state).

Yet another aspect of the present invention provides a cell power switching circuit in a semiconductor memory device and a method for applying a cell power voltage, capable of reducing standby current without degradation of an operation characteristic of a the device by applying a standby voltage as a cell power voltage only when a standby mode lasts for a relatively long period of time.

Yet another aspect of the present invention provides a technique for shortening a wake-up time so that a cell power voltage is rapidly recovered to a stable level of an operation voltage without degradation of an operation characteristic (when switched from a standby mode to an operation mode).

According to one embodiment of the present invention, there is provided a semiconductor device, comprising: a first power switch (e.g., P1 in FIG. 6) configured to selectively output a first power supply voltage (VOP) as the device power voltage in response to a first applied switch control signal (CSOPb), a second power switch (P2) configured to selectively output a second power supply voltage (VCP) as the device power voltage in response to a second applied switch control signal (CSPP), and a third power switch (P10) configured to selectively output a third power supply voltage (VSB) as the device power voltage in response to a third applied switch control signal (CPSBb). The first power supply voltage is lower than the second power supply voltage, and the third power supply voltage is lower than the first power supply voltage.

The device may further comprise a device power control unit for controlling states of the first, second and third switch control signals so that the device power voltage is applied as the third (lowest) power supply voltage in a standby state and that the device power voltage is supplied as the second power supply voltage during a predefined period of time and next as the first power supply voltage when the device is switched from a standby state to an operating state.

The device may further comprise a deep standby detection unit configured to receive an external enable signal (e.g., a memory "chip select" signal, and to determine whether the duration time of a non-operation state indicated by the external enable signal exceeds a predefined time, and to generate a deep standby detection signal for controlling the first, second, and third applied switch control signals.

According to another embodiment of the present invention, there is provided a memory cell power switching circuit in a semiconductor memory device. The cell power switching circuit includes a first power switching unit for selectively outputting, as a memory cell power voltage, either a first power supply voltage or a second power supply voltage to a first switching output stage in response to a first applied switch control signal, the second power supply voltage being higher than the first power supply voltage; a second power switching unit for outputting, as a cell power voltage, either an output voltage at the first switching output stage or a third power supply voltage to a second switching output stage in response to a second applied switch control signal, the third power supply voltage being lower than the first power supply voltage; and a cell power control unit for controlling states of the first and second switch control signals so that the cell power voltage is applied as the third power supply voltage in a standby state and that the cell power voltage is supplied as the second power supply voltage during a predefined period of time and then as the first power supply voltage when the standby state is switched to an operating state.

According to another aspect of the present invention, there is provided a semiconductor memory device including a memory cell array having a plurality of memory cells; a dual mode cell power switching circuit connected to one end of the memory cell array, the circuit including a first power switching unit for selectively outputting, as a cell power voltage, either a first power supply voltage or a second power supply voltage to a first switching output stage in response to a first applied switch control signal, the second power supply voltage being higher than the first power supply voltage; a second power switching unit for outputting, as a cell power voltage, either an output voltage at the first switching output stage or a third power supply voltage to a second switching output stage in response to a second applied switch control signal, the third power supply voltage being lower than the first power supply voltage; and a cell power control unit for controlling states of the first and second switch control signals so that the cell power voltage is applied as the third power supply voltage in a standby state and that the cell power voltage is supplied as the second power supply voltage during a predefined period of time and then as the first power supply voltage when the standby state is switched to an operating state; and a single mode cell power switching circuit connected to the other end of the memory cell array for outputting the first power supply voltage as a cell power voltage in response to a third applied switch control signal.

Preferably, the circuit may further include a deep standby detection unit for receiving a chip select signal, determining whether a duration time of the non-operation state exceeds a predefined time, and generating a deep standby detection signal to enable the cell power control unit to control the operation in the standby state when the non-operation duration time exceeds the predefined time.

The first power supply voltage may be provided as an operation voltage by an internal power supply voltage generating circuit in a chip, and the semiconductor memory device may be a static random access memory. The cell power voltage may be applied as a source voltage of a load MOS transistor that forms a memory cell of the static random access memory.

Further, the first power switching unit may include a first P-type MOS transistor having a source connected to the first power supply voltage, a drain connected to the first switching output stage, and a gate for receiving the first switch control signal; and a second P-type MOS transistor having a source connected to the second power supply voltage, a drain connected to the first switching output stage, and a gate for receiving the first switch control signal.

The second power switching unit may include the same elements as the first power switching unit.

The memory cell may be a three-dimensional memory cell comprising six cell transistors, (the six cell transistors being formed on a different layer), and the cell power voltage may be provided to an entire memory cell array via both ends of the memory cell array.

According to the structure of the circuit, it is possible to suppress leakage current in a standby operation and shorten a wake-up time when the standby mode is switched to an operation mode. It is also possible to reduce standby current without degradation of an operation characteristic of a device by applying a standby voltage as a cell power voltage only in a deep standby mode in which a standby mode lasts for a relatively long time.

BRIEF DESCRIPTION OF THE DRAWINGS

The above and other features of the present invention will become more apparent to those of ordinary skill in the art by describing in detail preferred embodiments thereof with reference to the attached drawings in which preferred embodiments of the invention are shown. However, the invention should not be construed as limited to only the embodiments set forth herein. Rather, these embodiments are presented as teaching examples. In the drawings, like numbers refer to like elements, and.

DETAILED DESCRIPTION OF EXEMPLARY EMBODIMENTS OF THE INVENTION

Figure 2:
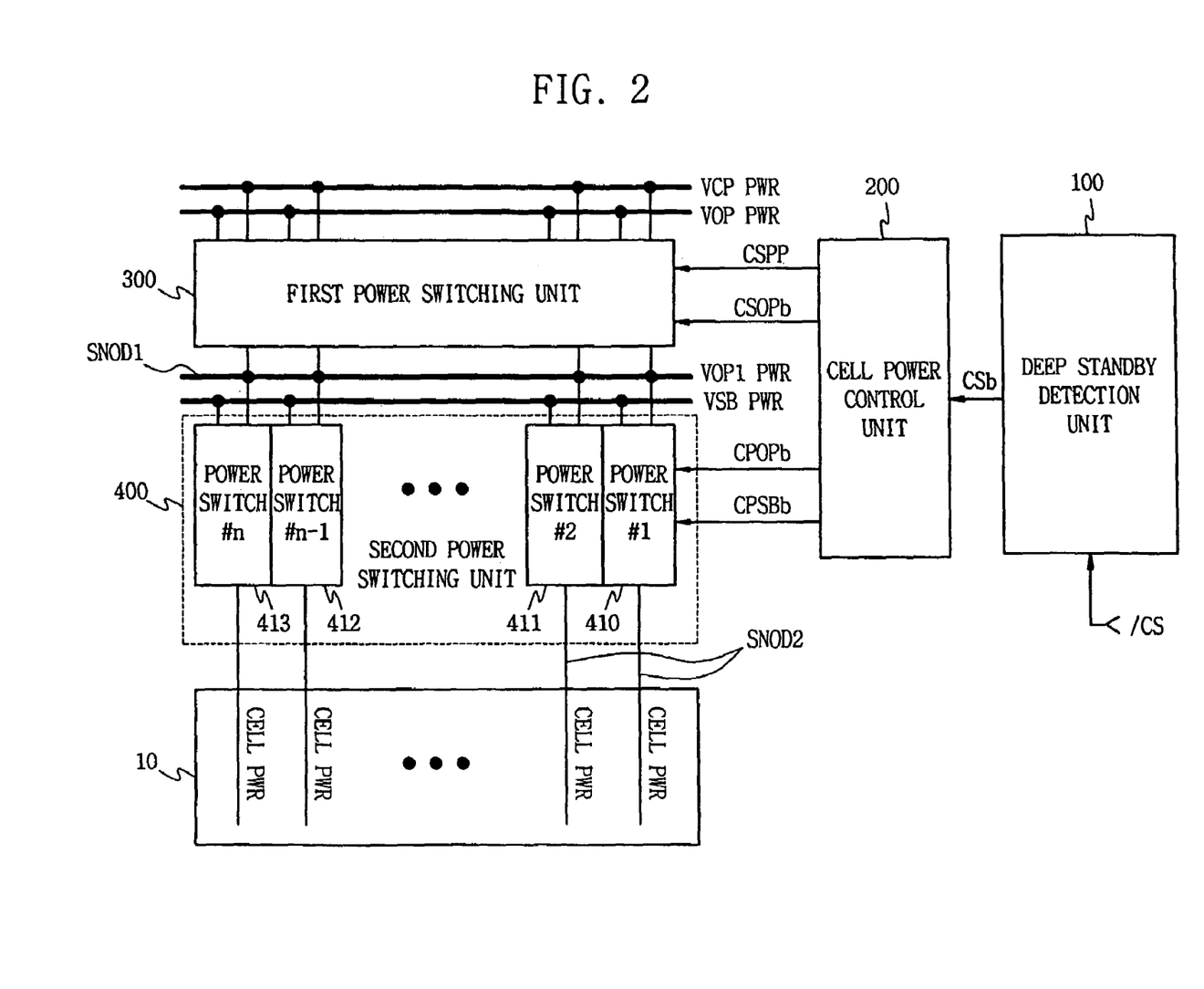
FIG. 2 is a block diagram of a memory cell power switching circuit according to a first exemplary embodiment of the present invention.

FIG. 2 is a block diagram of a memory cell power switching circuit according to a first embodiment of the present invention. In FIG. 2, a dual power mode switching structure used for controlling memory cell power in a memory cell is schematically shown. The memory cell power switching circuit of FIG. 2 can be formed on a semiconductor memory device chip.

Referring to FIG. 2, the circuit includes a deep standby detection unit 100, a cell power control unit 200, a first power switching unit 300, a second power switching unit 400, and a memory cell array 10.

The first power switching unit 300 selectively outputs one of an operation voltage VOP PWR or a high power supply voltage VCP PWR (higher than the operation voltage VOP PWR) to a first switching output stage SNOD1 in response to first switch control signals CSPP and CSOPb, respectively, applied by the cell power control unit 200.

The second power switching unit 400 includes a plurality of power switches 410 to 413 for selectively outputting either (one or the other one of) a low power supply voltage VSB PWR (lower than the operation voltage VOP PWR) supplied during the standby mode or a power supply voltage VOP1 PWR (at the first switching output stage SNOD1) to the second switching output stage SNOD2 (in response to second switch control signals CPOPb and CPSBb applied by the cell power control unit 200). A power supply voltage output to the second switching output stage SNOD2 is provided as a cell power voltage (VDD in FIG. 1) for memory cells in the memory cell array 10.

The deep standby detection unit 100 receives a chip select signal /CS and determines whether a standby duration time exceeds a predefined time, and generates a deep standby detection signal CSb for memory cell power control when the standby duration time exceeds the predefined time. The deep standby detection unit 100 disables the deep standby detection signal CSb within the duration of a relatively short non-operation period encountered while the semiconductor memory devices operate. In the case of a relatively short non-operation period, the cell power is maintained at the operation voltage, which is desirable since that suppresses an increase in the operation current.

The cell power control unit 200 outputs first switch control signals CSPP and CSOPb to the first power switching unit 300 and second switch control signals CPOPb and CPSBb to the second power switching unit 400, respectively, in response to the deep standby detection signal CSb (for efficient control of the cell power).

The first switch control signal CSPP is enabled during the standby period. If the first switch control signal CSPP is enabled, the first power switching unit 300 performs a (power) switching operation so that the high power supply voltage VCP PWR (higher than the operation voltage) appears at the first switching output stage SNOD1. The first switch control signal CSPP is disabled during a data access period, i.e., an operating period of the semiconductor memory device.

The first switch control signal CSOPb is enabled in the operating period of the semiconductor memory device. If the first switch control signal CSOPb is enabled, the first power switching unit 300 performs a (power) switching operation in order that the operation voltage VOP PWR appears at the first switching output stage SNOD1. The first switch control signal CSOPb is disabled during the standby period.

The second switch control signal CPOPb is enabled during an operating period of the semiconductor memory device. If the second switch control signal CPOPb is enabled, the second power switching unit 400 performs a (power) switching operation so that the power supply voltage VOP1 PWR (at the first switching output stage SNOD1) appears at the second switching output stage SNOD2. The second switch control signal CPOPb is enabled during the standby period.

The second switch control signal CPSBb is enabled in the standby period. If the second switch control signal CPSBb is enabled, the second power switching unit 400 performs a (power) switching operation in order that the low power supply voltage VSB PWR (lower than the operation voltage VOP PWR) appears at the second switching output stage SNOD2. The second switch control signal CPSBb is enabled during the operating period.

Figure 3:
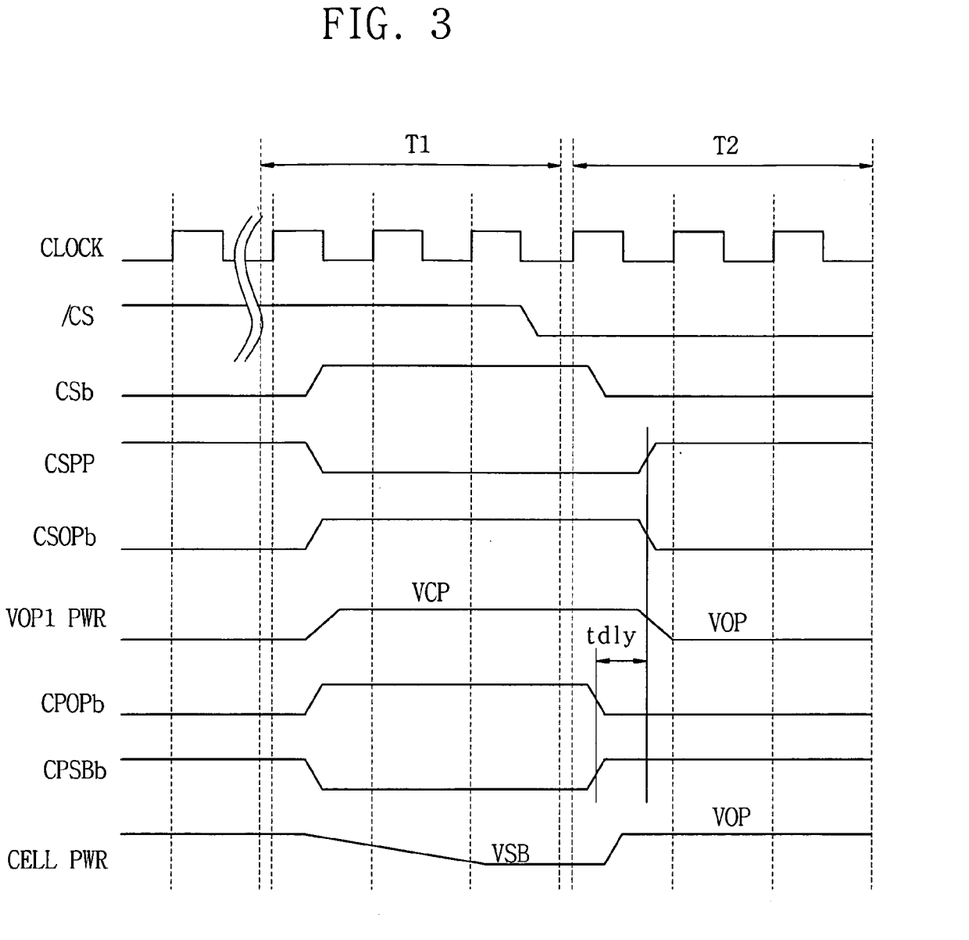
FIG. 3 is a timing diagram illustrating the operation of the memory cell power switching in the circuit of FIG. 2.

FIG. 3 is a timing diagram illustrating the operation (e.g., memory cell power switching operation) of the memory cell power switching in the circuit of FIG. 2. The timing of various signals in the circuit of FIG. 2 is shown in FIG. 3. Referring to FIG. 3 a timing relationship of waveforms of the first switch control signals CSPP and CSOPb and the second switch control signals CPOPb and CPSBb is explicitly shown. In FIG. 3, the period T1 indicates a deep standby period applied to an embodiment of the present invention; And the period T2 indicates a data access mode, i.e., an operating period of the semiconductor memory device. When the semiconductor memory device transitions from the deep standby period T1 to the operating period T2, the shorter the wake-up time of the cell power is, the better the performance of the semiconductor memory device is. Herein, the "wake-up time" means the measurable time for the cell power voltage at a standby voltage level to reach a level of the operation voltage VOP PWR. As seen from the timing diagram of FIG. 3, if a chip is not selected within a predefined time, (i.e., if the standby period lasts for a considerable time), the deep standby detection signal CSb is enabled so that the deep standby mode is entered. In the deep standby mode, the cell power voltage is applied as a standby power supply voltage (e.g., 1.0 to 1.2 V). If a chip is then selected, the deep standby detection signal CSb is disabled, and the cell power applying operation in the deep standby period T1 is terminated and a cell power applying operation in the operating period T2 is initiated. At the beginning of the operating period T2, an intentional delay of a switching time exists between the first switch control signals CSPP and CSOPb and the second switch control signals CPOPb and CPSBb for the purpose of a shortened wake-up time, which is preferable in the present invention. Thus, even though the second switch control signals CPOPb and CPSBb are enabled or disabled after the operating period T2 begins, the first switch control signals CSPP and CSOPb remain enabled or disabled even during a first clock period of the operating period T2 and, accordingly, a delay time period tdly (indicating the delay of the switching time) exists within the first clock period of the operating period T2. Accordingly, the cell power voltage CELL PWR is provided as a higher voltage VCP PWR than the operation voltage during the delay time period (to shorten the wake-up time). The higher voltage VCP PWR applied within the delay time period tdly enables a cell power node that remains at the standby voltage VSB PWR to rapidly reach a (higher) level of the operating voltage VOP PWR. If each of the first switch control signals CSPP and CSOPb is now disabled or enabled within the operating period T2, the cell power node is rapidly established at the level of the operation voltage VOP PWR without lagging with a conventional voltage level drop. In general, if a high voltage is temporarily applied as the cell power voltage at the beginning of the operating period and then the operation voltage is applied, the wake-up time is significantly shortened and the performance of the semiconductor memory device is enhanced, as compared to the conventional case where the operation voltage is continuously applied as the cell power voltage at the beginning of the operating period.

As described previously, the cell power switching circuit of FIG. 2 performing the cell power switching operation as further illustrated in FIG. 3 applies the standby voltage as the cell power voltage when the standby mode lasts for a relatively long (e.g., predetermined) time, thereby reducing standby current without degradation of an operation characteristic of the device; and rapidly restores the cell power voltage to a stable level of the operation voltage without degradation of an operation characteristic when the standby mode is switched to the operation mode, thereby minimizing the "wake-up time".

Other exemplary embodiments of the present invention having a basic concept in common with the first embodiment, but being modified or extended will be now described. In the case of the other exemplary embodiments, as in the case of the first embodiment, a voltage higher than the operation voltage is applied as a cell power voltage during a predefined time (within a shorter wake up time) when the standby state is switched to the operating state.

Figure 4:
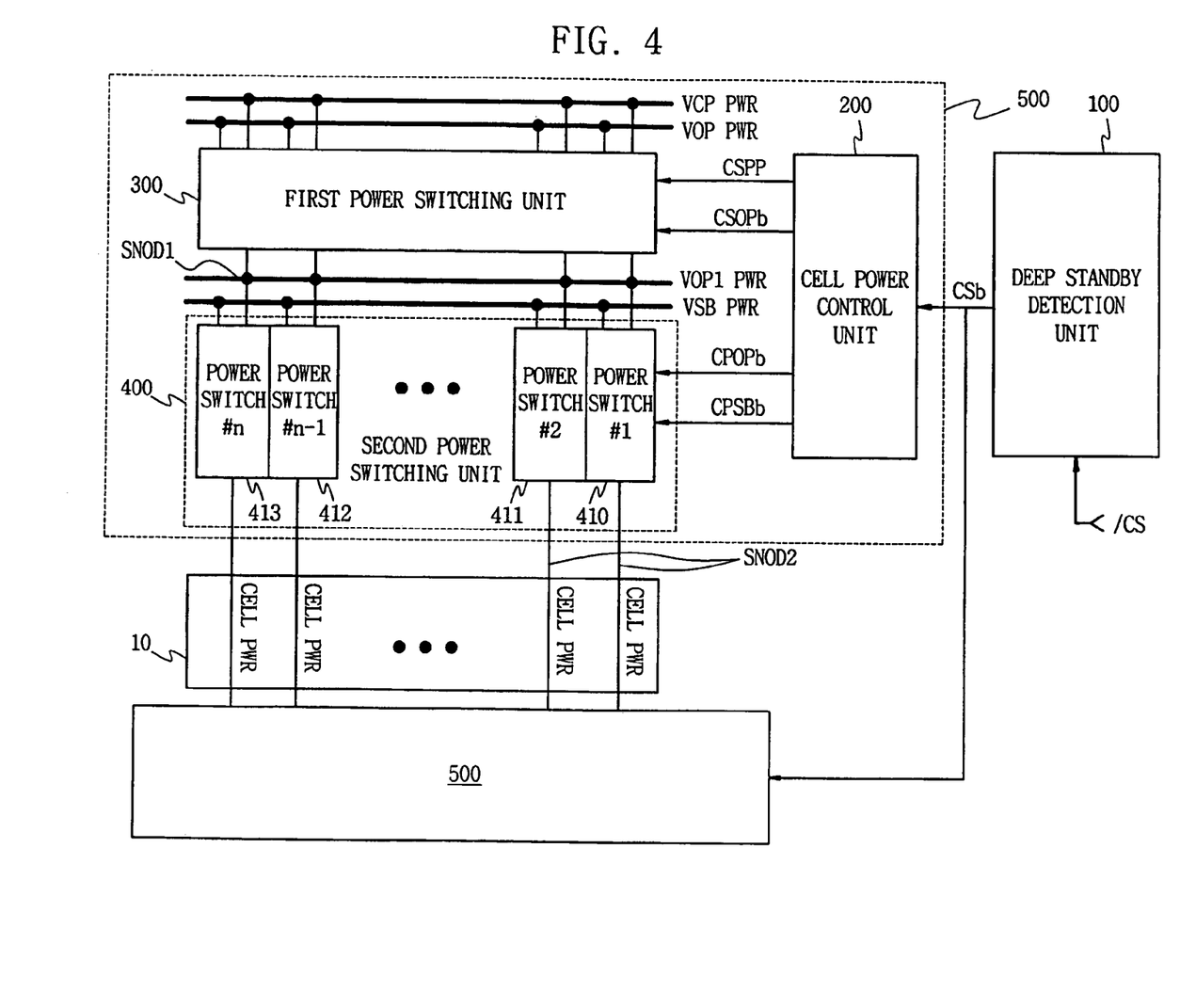
FIG. 4 is a block diagram of a memory cell power switching circuit according to a second exemplary embodiment of the present invention.

FIG. 4 is a block diagram of a memory cell power switching circuit according to a second embodiment of the present invention. Referring to FIG. 4, a memory cell power switching block 500 is a dual mode power switching structure, and includes a memory cell power control unit 200, a first power switching unit 300, and a second power switching unit 400), is operatively integrated with a memory cell array 10 (similarly as shown in FIG. 2). Further, in FIG. 4, the cell power switching circuit comprises a dual mode power switching structure (each comprised of a memory cell power switching block 500) connected at each end of the memory cell array 10 so that the cell power applying operation as described with reference to FIG. 3 is performed (mirrored) at both ends of the memory cell array 10, thereby resulting in a shorter wake-up time.

Figure 5:
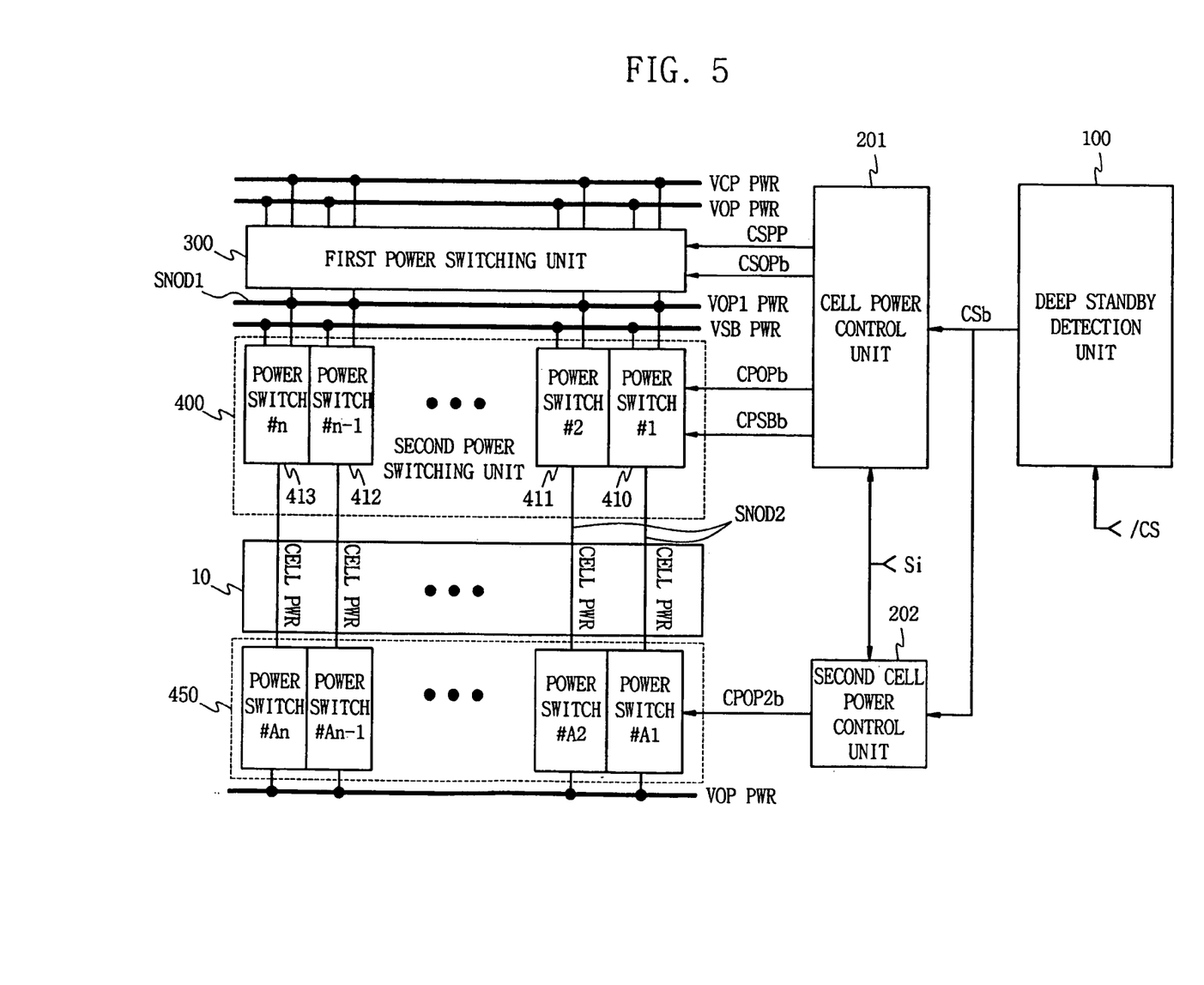
FIG. 5 is a block diagram of a memory cell power switching circuit according to a exemplary third embodiment of the present invention.

Similarly, FIG. 5 shows a block diagram of a cell power switching circuit according to a third exemplary embodiment of the present invention. In the case of FIG. 5, the third exemplary embodiment of the present invention is similar to the second exemplary embodiment except that only the second power switching unit 400 and a third power switching unit 450 (which is substantially the same as the second power switching unit 400) are provided (mirrored) at both ends of the memory cell array 10. Thus, in FIG. 5, a dual mode power switching structure (e.g., memory cell power switching block 500 of FIG. 4) is connected to one end of the memory cell array 10, and a single mode power switching structure (comprised of the third power switching unit 450, which is substantially the same as the second power switching unit 400) is connected to the other end of the memory cell array 10. Here, the third power switching unit 450 is controlled by a second cell power control unit 202. The configuration shown in FIG. 5 is also achieves a shorter wake-up time. Here, a third switch control signal CPOP2b applied to the third power switching unit 450 remains disabled in a standby period and becomes enabled when the standby mode is switched to the operation mode. Accordingly, in the standby state, the third power switching unit 450 blocks (suppresses) an operation voltage VOP PWR but when the memory device switches from the standby mode to the operation mode supplies the operation voltage VOP PWR as a cell power voltage to obtain a short wake-up time.

In FIG. 5, a block select signal Si is applied to the second cell power control unit 202 and to a first cell power control unit 201 in common. In response to the block select signal Si, a memory cell power voltage is applied in a unit of a memory cell array block when the block is switched from the standby mode to the operation mode. This limits a peak current and suppresses noise. Accordingly, the memory cell power voltage is rapidly stabilized (e.g., raised) into an operation voltage VOP PWR, unlike the case where the memory cell power voltage is applied to all the memory cells in the array at one and the same time. Here, the operation voltage VOP PWR, not the standby power supply voltage, is applied to the selected memory cell array block, to which the operation voltage has been applied as the cell power voltage, by the time the circuit enters a deep standby mode even though the block select signal Si is disabled. This is because the number of wake-up operations greatly increases if the wake-up operation is performed whenever there is a standby period relatively shorter than a deep standby period, resulting in deteriorated operating stability. It will be apparent that the block select signal Si may also be applicable to the first and second embodiments as described above.

Figure 6:
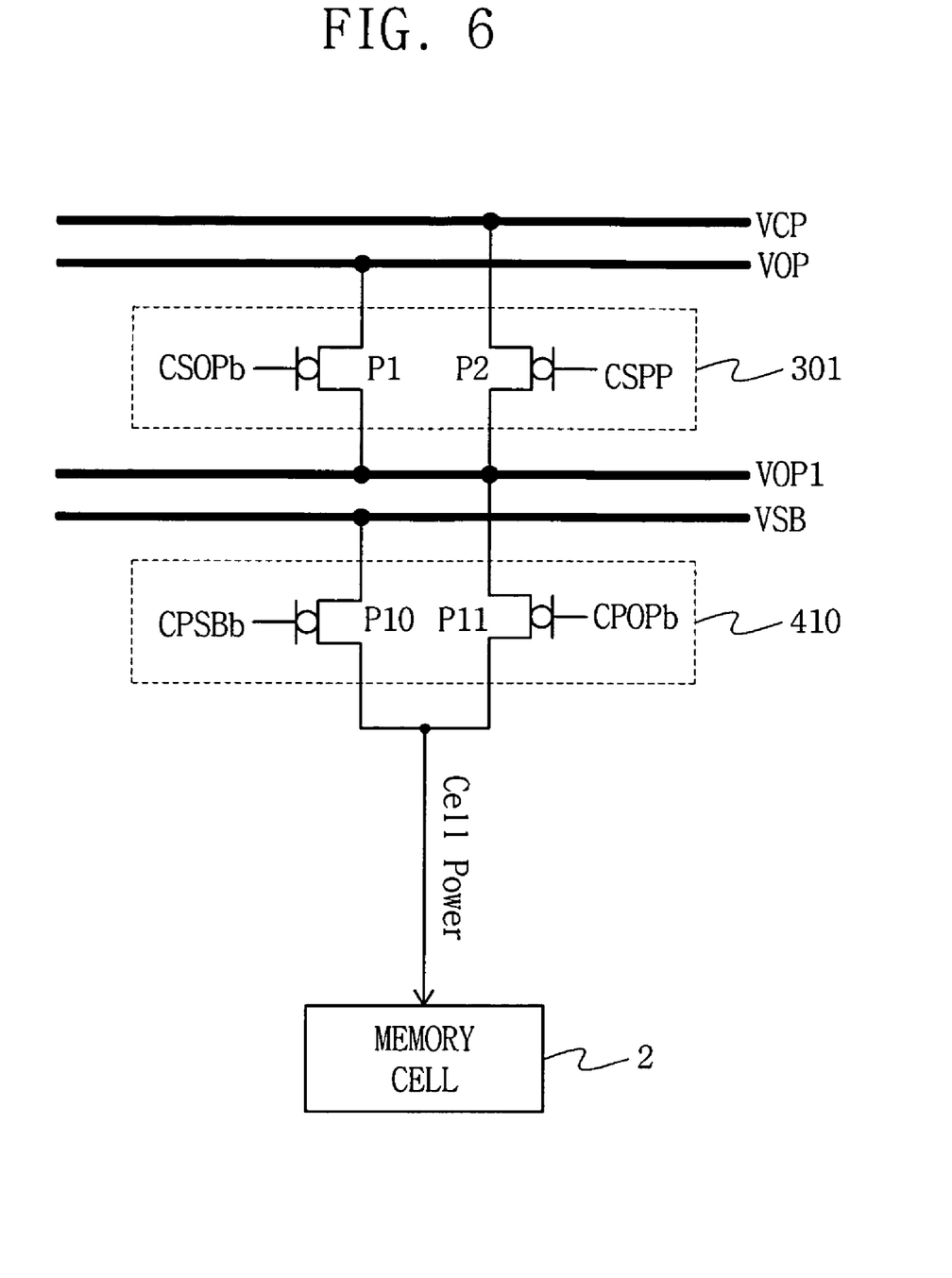
FIG. 6 is a circuit diagram showing an implementation example of the first and second power switching units 300 and 400 (of FIGS. 2, 4, and 5)

FIG. 6 is a circuit diagram showing an implementation example of the first and second power switching units 300 and 400 (of FIGS. 2, 4, and 5). The first power switching unit 300 (e.g., 301) is composed of two P-type field effect (FET, e.g., MOSFET) transistors P1 and P2 and a power switch #1 410 included within the second power switching unit 400 is similarly composed of two P-type MOS transistors P10 and P11. When the first switch control signals CSPP and CSOPb are applied in low and high states, respectively, the P-type MOS transistor P2 is turned ON and the P-type MOS transistor P1 is turned OFF, such that the node voltage VOP1 at the first switching output stage is developed into a high voltage VCP (higher than the operation voltage). The high voltage VCP is applied as a cell power voltage of the memory cell 2 when the P-type MOS transistor P11 in the second power switching unit 400 is turned ON. While the first and second power switching units 300 and 400 have been implemented by the P-type MOS transistors in FIG. 6, it will be apparent that they may be implemented by N type MOS transistor or CMOS transport gates, and by various other forms of switches.

Figure 7:
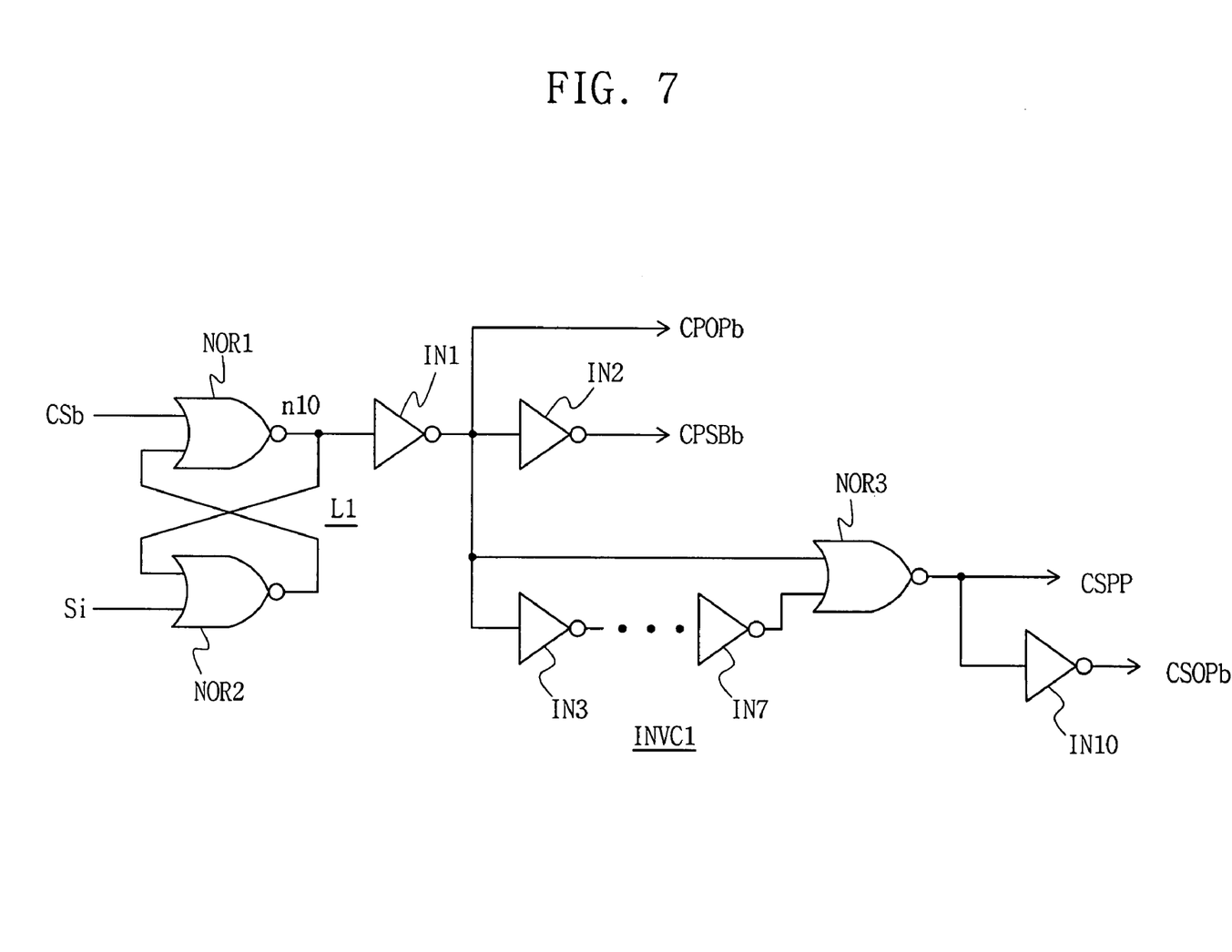
FIG. 7 is a circuit diagram illustrating an implementation example of a memory cell power control unit 201 of FIG. 5.

FIG. 7 is a circuit diagram illustrating an implementation example of a memory cell power control unit (e.g., 201 of FIG. 5). Referring to FIG. 7, the memory cell power control unit 201 includes a latch L1 (composed of cross-coupled NOR-gates NOR1 and NOR2), inverters, and an inverter chain INVC1 (composed of a plurality of inverters IN3-IN7). In the exemplary memory cell power control unit of FIG. 7, even though a standby mode is switched to an operating mode, a first cell array block (identified and selected by the block select signal Si) is selected, and then an operation voltage is applied to the selected memory cell array block, power switching operation is prohibited by the latch L1 by the time the circuit enters a deep standby mode.

Figure 8:
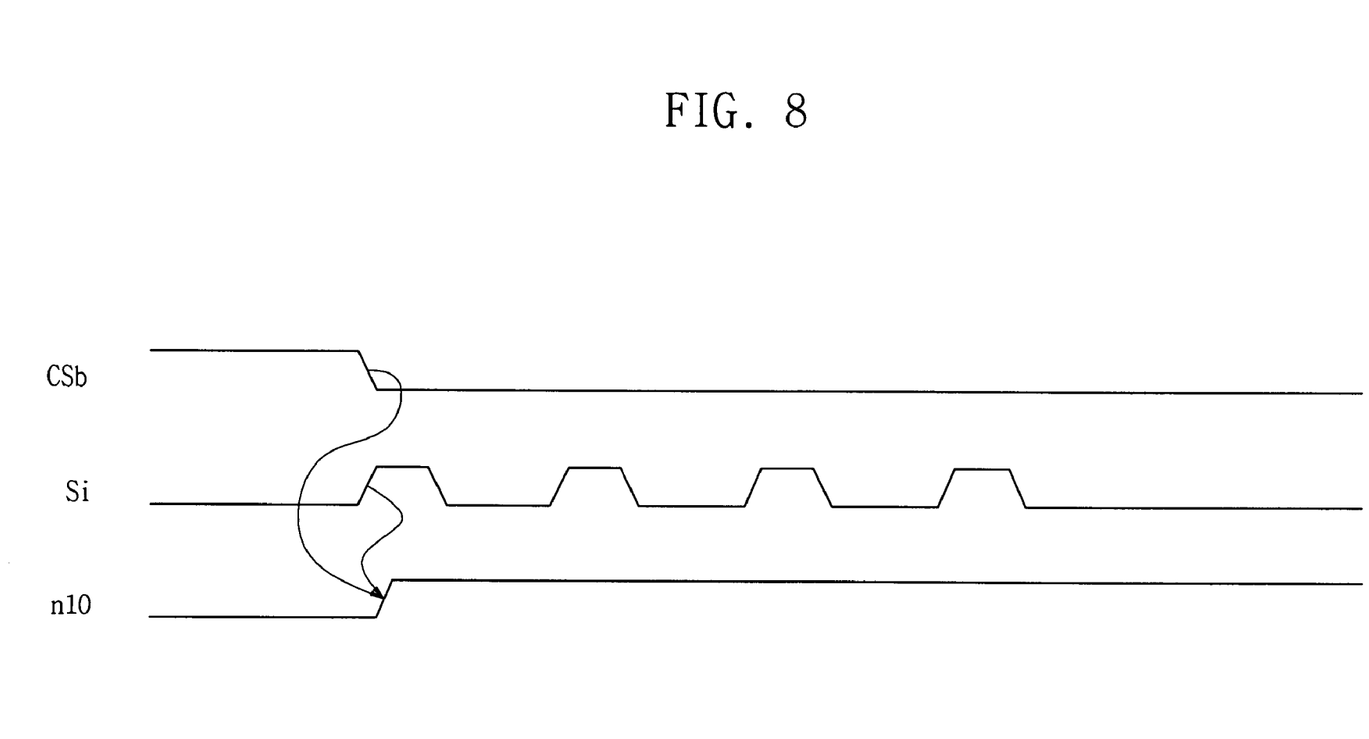
FIG. 8 is a timing diagram illustrating the operation of the memory cell power switching in the circuit of FIG. 7.

FIG. 8 shows an timing diagram illustrating the operation of the memory cell power switching in the circuit of FIG. 7. When the deep standby detection signal CSb is transitioned to a low level and the block select signal Si is applied at a high level, a high level signal is output at an output node n10 of the latch L1 (shown in FIG. 7). As a result, in the circuit of FIG. 7, the output node n10 remains at a high state when the block select signal Si is transitioned from a high level to a low level.

Figure 9:
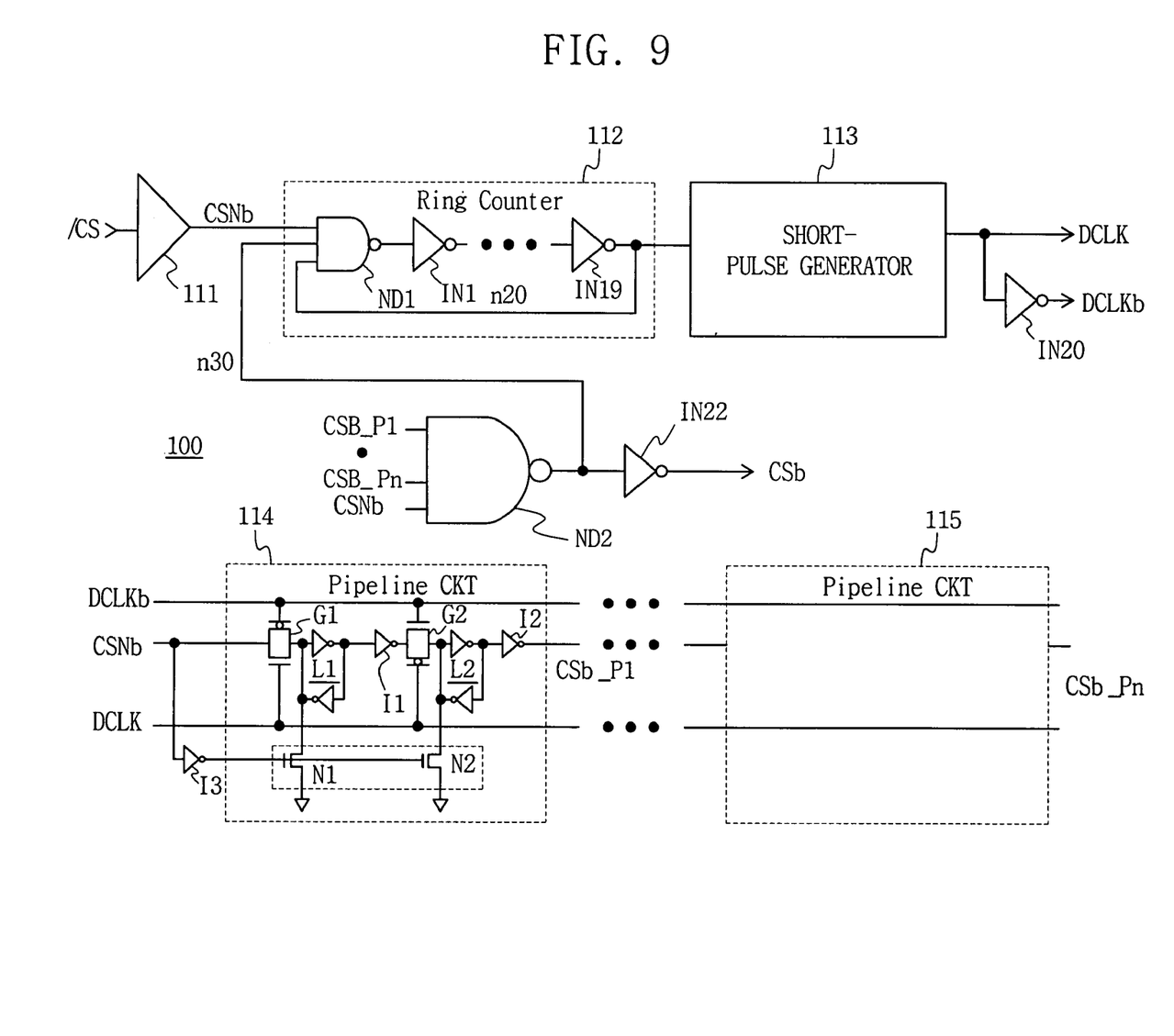
FIG. 9 illustrates an exemplary implementation of a deep standby detection unit according to an embodiment of the present invention.
Figure 10:
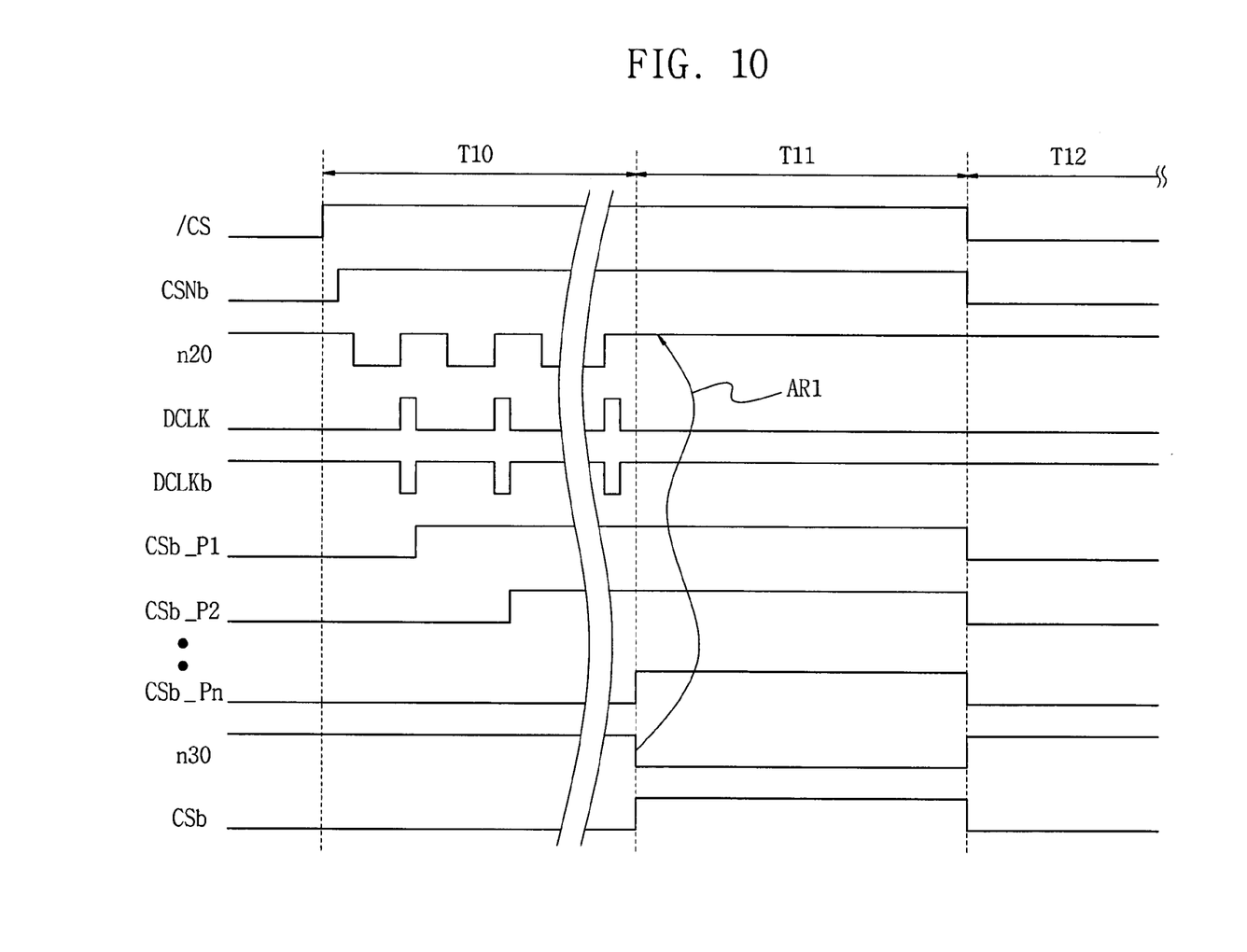
FIG. 10 is a timing diagram illustrating the operation of the memory cell power switching in the circuit of FIG. 9.

FIG. 9 is a circuit diagram illustrating an implementation example of a deep standby detection unit according to embodiments of the present invention. FIG. 10 is a timing diagram illustrating the operation of the memory cell power switching in the circuit of FIG. 9, showing waveforms of various signals shown in FIG. 9.

In FIG. 9, a deep standby detection unit 100 is composed of a receiver 111 (e.g., a non-inverting buffer), a ring counter 112, a short-pulse generator 113, a NAND gate ND2, and pipeline blocks 114 and 115.

Referring to FIGS. 9 & 10, the deep standby detection unit 100 is responsive to an output signal CSNb of the receiver 111 that receives and buffers an external chip select signal /CS. Thus, if a chip is disabled, the chip select signal /CS becomes at a high (H) level and an output signal CSNb of the receiver 111 becomes at a high level. If the output signal CSNb is applied at a high level, the ring counter 112 (composed of an NAND-gate ND1 and a plurality of inverters IN1-IN19) is activated. An output (from the last inverter, e.g., IN19) at output node n20 of the ring counter 112 is applied to the short-pulse generator 113 and also fed back to a second input of the NAND-gate ND1. Upon receipt of the output of the ring counter 112 (at node n20), the short-pulse generator 113 generates internal clocks DCLK and DCLKb, (as shown in FIG. 10). The internal clocks DCLK and DCLKb are provided as clocks for turning ON control gates of the pipeline blocks 114 and 115 (FIG. 9).

Each of the pipeline blocks (e.g., 114 and 115) includes a first transport gate G1 and a first (inverter) latch L1 and a first inverter, and a second a transport gate G2 and a second (inverter) latch L2 and a second inverter I2, and corresponding reset transistors N1 and N2. The output signal CSNb applied to an input of a first transport gate G1 in the first pipeline block 114 is applied to a first inverter latch L1 via the first transport gate G1 when the internal clocks DCLK and DCLKb are provided at high and low levels, respectively. The output signal CSNb is inverted by the first inverter latch L1, further inverted by a first inverter I1, and is applied to a second transport gate G2. The second transport gate G2 is turned ON when the internal clocks DCLK and DCLKb are provided at low and high levels, respectively, and applies the output signal CSNb to a second inverter latch L2. Since a signal CSB_P1 output via a the second inverter I2 connected via the second latch L2 is delayed via the single pipeline block 114, it is called a "1-pipeline processing" delayed output. The NAND gate ND2 combines CSB_P1 obtained by "1-pipeline processing" the output signal CSNb, and CSB_P2 obtained by "2-pipeline processing" the output signal CSNb, . . . and CSB_Pn obtained by "n-pipeline processing" the output signal CSNb, and the output signal CSNb to generate a combined output at node n30. The combined output at node n30 is applied as a third input to the NAND gate ND1 of the ring counter 112 and to an inverter IN22. The inverter IN22 inverts the combined output at n30 to generate a deep standby detection signal CSb at a high level. The deep standby detection signal CSb is generated when a standby state lasts for a time exceeding a predefined time (e.g., defined by the sum of the n pipeline delay circuits 114 through 115).

When the circuit enters the deep standby mode, the combined output at node n30 becomes at a low state to block the operation of the ring counter 112. If the chip is enabled (/CS=L), the output CSNb of the receiver 111 reverts to a low state and the deep standby signal CSb is transitioned to a low state within a short time. Further, logic levels latched in each of the pipeline blocks 114 through 115 are initialized to a low state (by internal NMOS reset transistors N1 and N2).

Figure 11:
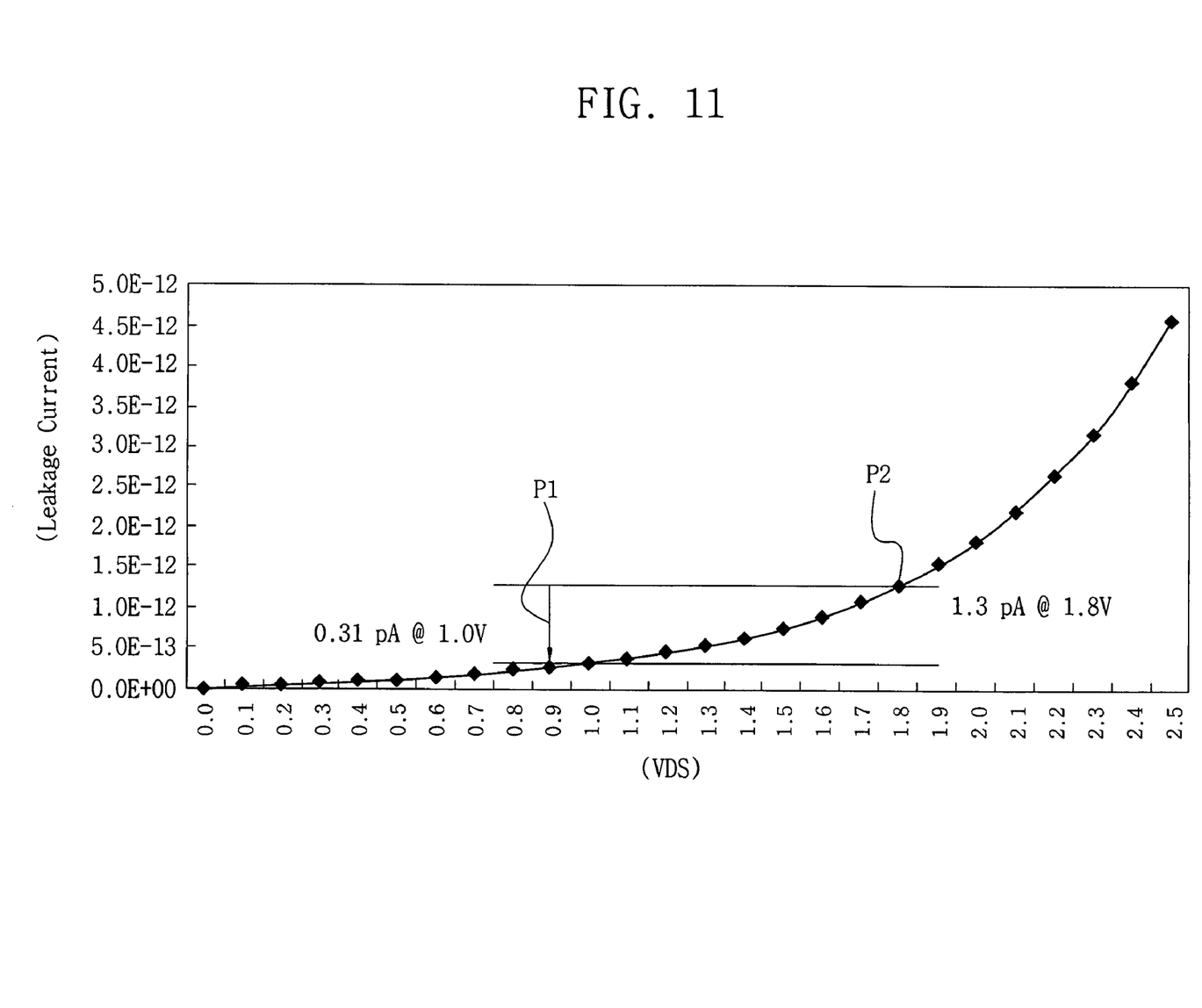
FIG. 11 is a transistor characteristic graph annotated to illustrate a leakage current reduction effect according to embodiments of the present invention.

FIG. 11 is a transistor characteristic graph annotated for illustrating a leakage current reduction effect according to at least one of the exemplary embodiments of the present invention. In FIG. 11, a horizontal axis indicates a drain-source voltage VDS and a vertical axis indicates an amount of leakage current. The point P2 denotes the prior art, point P1 denotes the achievement of embodiments of the invention. Advantageously, the amount of leakage current is significantly reduced from a prior art point P2 to an inventive point P1. Thus, a semiconductor memory device according to the present invention has a lower battery power consumption characteristic, and therefore, it is beneficially applicable to portable electronic devices.

As described above, according to various embodiments of the present invention, a lower voltage than an operation voltage is applied in a standby mode, thereby minimizing or reducing current flowing through transistors in the memory cells. Further, dual power mode switches are used when the standby mode is switched to the operation mode, thereby shortening a wake-up time. Accordingly, standby current is reduced and a wake-up time is shortened without degradation of a memory device characteristic. In particular, in a static random access memory (SRAM) having 6 transistor memory cells as a memory cell structure, the lower memory cell power voltage applied to a P-type MOS transistor in the memory cell is applied using the memory cell power switching circuit of the present invention, easily achieving low-power implementation without degradation of device performance.

Stabilized operation is obtained by not applying the standby voltage but maintaining the supplied operation voltage during a short non-operation period encountered during operation of a semiconductor memory device. Thus, since a (deep) standby state lasting during a certain (prolonged, predetermined) period of time is automatically detected by using the deep standby detection unit, a standby voltage is prevented from being applied as the memory cell power voltage in a short standby (non-operation state) during a short period of time.

It will be appreciated by those skilled in the art that the concept disclosed herein is applicable to various power saving applications, and may be implemented in many various ways. The number of switches in the suggested power switching units or a detail of the cell power control unit and the deep standby detection unit only an example of implementation in the exemplary embodiments of the present invention and there may be other methods available to circuit designers. Accordingly, detailed implementations are disclosed as examples for implementing the present invention, but do not limit the scope of claims.

While the detailed embodiments of the present invention have been described, various variations may be made to the present invention without departing from the scope of the present invention as defined in the claims. For example, the embodiments may be modified to implement different memory cell power switching operations in a standby mode, and not the deep standby mode.

As described above, according to the exemplary embodiments of the present invention, it is possible to suppress leakage current in standby (non-operation) mode and shorten a wake-up time when a standby mode is switched to an operation mode. It is also possible to reduce standby current without degradation of an operation characteristic of a memory device (or other device) by applying a standby voltage as a power voltage only when a standby mode lasts for a relatively long period of time. It is also possible to rapidly recover a power voltage to a stable level of an operation voltage without degradation of an operation characteristic when a standby mode is switched to an operation mode. Accordingly, the present invention is beneficially applicable to a mobile-oriented static random access memory SRAM) requiring a low-power characteristic in standby operation.

What is claimed is:

1. A semiconductor device, comprising:
   a first power switch configured to selectively output a first power supply voltage as a device power voltage in response to a first applied switch control signal;
   a second power switch configured to selectively output a second power supply voltage as the device power voltage in response to a second applied switch control signal;
   a third power switch configured to selectively output a third power supply voltage as the device power voltage in response to a third applied switch control signal; and
   a device power control unit for controlling states of the first, second and third switch control signals so that the device power voltage is supplied as the third power supply voltage when the device is in a standby state and that the device power voltage is supplied as the second power supply voltage during a predefined period of time and next as the first power supply voltage when the device is switched from the standby state to an operating state,
   wherein the first power supply voltage is lower than the second power supply voltage, and the third power supply voltage is lower than the first power supply voltage.

2. The device according to claim 1, wherein the device includes a semiconductor memory device.

3. The device according to claim 1, wherein the device includes a processor.

4. The device according to claim 1, wherein the device includes a digital signal processor (DSP).

5. A semiconductor device, comprising:
   a first power switch configured to selectively output a first power supply voltage as a device power voltage in response to a first applied switch control signal;
   a second power switch configured to selectively output a second power supply voltage as the device power voltage in response to a second applied switch control signal;
   a third power switch configured to selectively output a third power supply voltage as the device power voltage in response to a third applied switch control signal; and
   a deep standby detection unit configured to receive an external enable signal, and to determine whether a duration time of a non-operation state indicated by the external enable signal exceeds a predefined time, and to generate a deep standby detection signal for controlling the first, second, and third applied switch control signals.

6. The device according to claim 5, wherein the deep standby detection signal enables a memory cell power control unit to cause the device to enter the standby state when the non-operation duration time exceeds the predefined time.

7. The device according to claim 1, wherein the device comprises an internal power supply voltage generating circuit to provide the first power supply voltage as an operation voltage.

8. The device according to claim 1, wherein the device is a static random access memory (SRAM) device.

9. The device according to claim 8, wherein the device power voltage is applied to the source of a load MOS transistor of a memory cell in the static random access memory (SRAM) device.

10. The device according to claim 1, further comprising:
a first P-type switch having a source connected to the first power supply voltage, and a gate for receiving the first switch control signal; and
a second P-type switch having a source connected to the second power supply voltage, and a gate for receiving the second switch control signal.

11. The device according to claim 10, further comprising a third P-type switch having a source connected to the third power supply voltage, and a gate for receiving the third switch control signal.

12. The device according to claim 1, further comprising a memory cell formed as a three-dimensional memory cell comprising six transistors.

13. The device according to claim 1, wherein the device power voltage is applied at both ends of each bitline in a memory cell array in the device.

14. A semiconductor memory device comprising:
a memory cell array having a plurality of memory cells;
a memory cell power control unit for controlling a memory cell power voltage so that the memory cell power voltage is applied as a third power supply voltage while the device is in a standby state, and when the standby state is switched to an operating state, the memory cell power voltage is supplied as a second power supply voltage during a predefined period of time and next as the first power supply voltage.

15. The device according to claim 14, wherein the second power supply voltage is higher than the first power supply voltage and the third power supply voltage is lower than the first power supply voltage.

16. The device according to claim 14, further comprising a deep standby detection unit configured to receive a chip select signal, and to determine whether a duration time of a non-operation state exceeds a predefined time, and to generate a deep standby detection signal to enable the memory cell power control unit to cause the device to switch to the standby state when the duration time exceeds the predefined time.

17. The device according to claim 16, wherein the memory cell power voltage is selectively applied to a cell block in the memory cell array.

18. A method for applying a cell power voltage in a semiconductor memory device, the method comprising the steps of:
applying a voltage lower than an operation voltage as a cell power voltage within a standby state;
applying a voltage higher than the operation voltage as the cell power voltage for a predefined period time when the standby state is switched to an operating state; and
applying the operation voltage as the cell power voltage when the predefined time elapses.

19. The method according to claim 18, wherein the operation voltage is provided to a load transistor of a static random access memory (S RAM) cell.

* * * * *